US012266399B2

(12) United States Patent
She

(10) Patent No.: US 12,266,399 B2
(45) Date of Patent: Apr. 1, 2025

(54) WRITE OPERATION ASSIST CIRCUIT

(71) Applicant: SPREADTRUM COMMUNICATIONS (SHANGHAI) CO., LTD., Shanghai (CN)

(72) Inventor: Yiqi She, Shanghai (CN)

(73) Assignee: SPREADTRUM COMMUNICATIONS (SHANGHAI) CO., LTD., Shanghai (CN)

( * ) Notice: Subject to any disclaimer, the term of this patent is extended or adjusted under 35 U.S.C. 154(b) by 463 days.

(21) Appl. No.: 17/790,281

(22) PCT Filed: Nov. 19, 2020

(86) PCT No.: PCT/CN2020/130038
§ 371 (c)(1),
(2) Date: Jul. 6, 2022

(87) PCT Pub. No.: WO2021/135706
PCT Pub. Date: Jul. 8, 2021

(65) Prior Publication Data
US 2022/0358997 A1 Nov. 10, 2022

(30) Foreign Application Priority Data
Dec. 31, 2019 (CN) .......................... 201911417706.7

(51) Int. Cl.
*G11C 11/40* (2006.01)
*G11C 11/4076* (2006.01)
(Continued)

(52) U.S. Cl.
CPC ...... *G11C 11/4096* (2013.01); *G11C 11/4076* (2013.01); *G11C 11/4094* (2013.01)

(58) Field of Classification Search
CPC ............ G11C 11/4096; G11C 11/4076; G11C 11/4094; G11C 7/12; G11C 11/419;
(Continued)

(56) References Cited

U.S. PATENT DOCUMENTS

2003/0103368 A1* 6/2003 Arimoto ............... G11C 29/028
365/230.06
2010/0188909 A1 7/2010 Kenkare et al.
(Continued)

FOREIGN PATENT DOCUMENTS

| CN | 102301424 A | 12/2011 |
| CN | 108694975 A | 10/2018 |
| CN | 111179990 A | 5/2020 |

OTHER PUBLICATIONS

EPO Extended European Search Report for corresponding EP Application No. 20910810.9; Issued on Feb. 28, 2023.
(Continued)

*Primary Examiner* — Mohammed A Bashar
(74) *Attorney, Agent, or Firm* — CANTOR COLBURN LLP

(57) ABSTRACT

A write operation assist circuit is provided, including: pre-charging circuit, a drive signal circuit, a programmable delay circuit, a charge pump, a write driving circuit and a column selector, wherein the pre-charging circuit has a pre-charging signal output terminal coupled to a pre-charging signal input terminal of the drive signal circuit, a first voltage output terminal coupled to a first bit line, and a second voltage output terminal coupled to a second bit line; the driving signal circuit has a first input terminal coupled to the first bit line, a second input terminal coupled to the second bit line, a first output terminal coupled to a first input terminal of the programmable delay circuit, and a second output terminal coupled to a second input terminal of the (Continued)

programmable delay circuit; the programmable delay circuit has an output terminal coupled to a first terminal of the charge pump.

9 Claims, 2 Drawing Sheets

(51) Int. Cl.
*G11C 11/4094* (2006.01)
*G11C 11/4096* (2006.01)

(58) Field of Classification Search
CPC ... G11C 29/028; G11C 29/023; G11C 7/1096; G11C 7/222; G11C 11/412
See application file for complete search history.

(56) References Cited

U.S. PATENT DOCUMENTS

| | | | |
|---|---|---|---|
| 2011/0019493 A1 | 1/2011 | Keda et al. | |
| 2014/0119099 A1* | 5/2014 | Clark | H10B 12/50 365/149 |
| 2014/0169106 A1* | 6/2014 | Kolar | G11C 7/10 365/189.11 |
| 2014/0210535 A1* | 7/2014 | Bartling | G11C 14/0072 327/199 |
| 2015/0131364 A1 | 5/2015 | Hsieh et al. | |
| 2015/0206577 A1 | 7/2015 | Gong et al. | |
| 2017/0358345 A1 | 12/2017 | Kumar et al. | |
| 2018/0294018 A1 | 10/2018 | Baeck et al. | |

OTHER PUBLICATIONS

International Search Report for International Application No. PCT/CN2020/130038; Date of Mailing, Feb. 20, 2021.

* cited by examiner

WRITE OPERATION ASSIST CIRCUIT

CROSS-REFERENCE TO RELATED APPLICATIONS

This is the National Stage of International Application No. PCT/CN2020/130038, filed on Nov. 19, 2020. Priority under 35 U.S.C. § 119(a) and 35 U.S.C. § 365(b) is claimed from Chinese Patent Application No. 201911417706.7, filed on Dec. 31, 2019, the disclosure of which is also incorporated herein by reference.

TECHNICAL FIELD

The present disclosure generally relates to Static Random-Access Memory (SRAM) technology field, and more particularly, to a write operation assist circuit.

BACKGROUND

With the development of advanced technology, changes in process parameters brought by processes, such as random doping fluctuation, make SRAM design more and more challenging, where stability of a write operation is major difficulty in SRAM design.

SUMMARY

Embodiments of the present disclosure provide a write operation assist circuit that does not rely on an external driving signal.

In an embodiment of the present disclosure, a write operation assist circuit is provided, including: a pre-charging circuit, a drive signal circuit, a programmable delay circuit, a charge pump, a write driving circuit and a column selector, wherein the pre-charging circuit has a pre-charging signal output terminal coupled to a pre-charging signal input terminal of the drive signal circuit, a first voltage output terminal coupled to a first bit line, and a second voltage output terminal coupled to a second bit line; the driving signal circuit has a first input terminal coupled to the first bit line, a second input terminal coupled to the second bit line, a first output terminal coupled to a first input terminal of the programmable delay circuit, and a second output terminal coupled to a second input terminal of the programmable delay circuit; the programmable delay circuit has an output terminal coupled to a first terminal of the charge pump; the charge pump has a second terminal coupled to a ground terminal of the write driving circuit; the write driving circuit has a first input terminal which is input with a first level, a second input terminal which is input with a second level, a first output terminal coupled to a first input terminal of the column selector, and a second output terminal coupled to a second input terminal of the column selector, wherein the first level is inverse to the second level; and the column selector has a first output terminal coupled to the first bit line, and a second output terminal coupled to the second bit line.

DETAILED DESCRIPTION

As described in the background, the exiting write operation assist circuit can improve the stability of the write operation for SRAM. The charge pump in the write operation assist circuit is driven by a drive signal which is provided by an external control circuit or generated by a Dummy circuit, so as to meet timing requirements of the write operation. Therefore, in the existing techniques, when the charge pump uses an external driving signal, the timing requirements on the driving signal are relatively strict.

In embodiments of the present disclosure, a write driving circuit outputs a first level to a first bit line, and outputs a second level to a second bit line, and the first level is inverse to the second level. A charge pump is driven to operate by the first bit line and the second bit line. Therefore, when writing to a SRAM, no external drive signal is required to drive the charge pump, and no drive signal with strict timing requirements is required.

In order to clarify the object, characteristic and advantages of embodiments of the present disclosure, embodiments of present disclosure will be described clearly in detail in conjunction with accompanying drawings.

Figure 1:
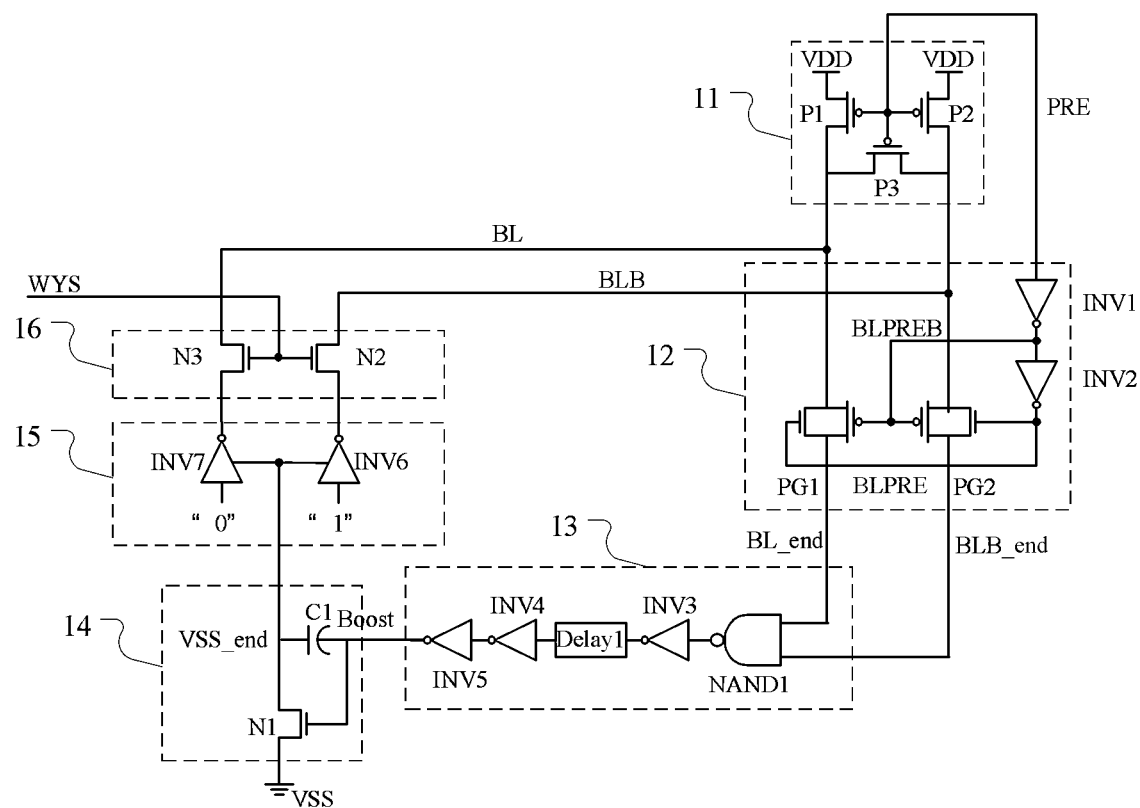
FIG. 1 is a structural diagram of a write operation assist circuit according to an embodiment.

Referring to FIG. 1, a write operation assist circuit is provided in an embodiment.

In some embodiments, the write operation assist circuit includes a pre-charging circuit 11, a drive signal circuit 12, a programmable delay circuit 13, a charge pump 14, a write driving circuit 15 and a column selector 16.

The pre-charging circuit 11 has a pre-charging signal output terminal, a first voltage output terminal and a second voltage output terminal. The pre-charging signal output terminal may output a pre-charging signal PRE to a pre-charging signal input terminal of the drive signal circuit 12, the first voltage output terminal is coupled to a first bit line BL, and a second voltage output terminal is coupled to a second bit line BLB.

The pre-charging signal input terminal of the drive signal circuit 12 may receive the pre-charging signal PRE output by the pre-charging circuit 11. The driving signal circuit 12 has a first output terminal coupled to a first input terminal of the programmable delay circuit 13, and a second output terminal coupled to a second input terminal of the programmable delay circuit 13.

The programmable delay circuit 13 has the first input terminal coupled to the first output terminal of the drive signal circuit 12, the second input terminal coupled to the second output terminal of the drive signal circuit 12, and an output terminal coupled to a first terminal of the charge pump 14.

The charge pump 14 has the first terminal coupled to the output terminal of the programmable delay circuit 13, and a second terminal coupled to a ground terminal of the write driving circuit 15.

The write driving circuit 15 has a first input terminal which is input with a first level, a second input terminal which is input with a second level, a first output terminal coupled to a first input terminal of the column selector 16, and a second output terminal coupled to a second input terminal of the column selector 16, wherein the first level is inverse to the second level.

The column selector 16 has the first input terminal coupled to the first output terminal of the write driving circuit 15, the second input terminal coupled to the second output terminal of the write driving circuit 15, a first output terminal coupled to the first bit line BL, and a second output terminal coupled to the second bit line BLB.

Each component in the write operation assist circuit is described in detail below.

In some embodiments, the pre-charging circuit 11 includes a first PMOS transistor P1, a second PMOS transistor P2 and a third PMOS transistor P3.

The first PMOS transistor P1 has a source coupled to a preset voltage source VDD, a gate coupled to a gate of the second PMOS transistor P2 and a gate of the third PMOS transistor P3, and a drain coupled to a source of the third PMOS transistor P3.

The second PMOS transistor P2 has a source coupled to the preset voltage source VDD, the gate coupled to the gate of the third PMOS transistor P3 and the gate of the first PMOS transistor P1, and a drain coupled to a drain of the third PMOS transistor P3.

The third PMOS transistor P3 has a source coupled to the drain of the first PMOS transistor P1, the gate coupled to the gate of the first PMOS transistor P1 and the gate of the second PMOS transistor P2, and the drain coupled to the drain of the second PMOS transistor P2.

It should be noted that, in the embodiments of the present disclosure, the third PMOS transistor P3 is configured to make voltages output by the first voltage output terminal and the second voltage output terminal of the pre-charging circuit 11 be equal. Therefore, the drain of the third PMOS transistor P3 may be coupled to the drain of the first PMOS transistor P1, and the source of the third PMOS transistor P3 may be coupled to the drain of the second PMOS transistor P2.

In some embodiments, the drive signal circuit 12 includes a first transmission gate PG1, a second transmission gate PG2, a first inverter INV1 and a second inverter INV2.

The first transmission gate PG1 has an input terminal coupled to the first bit line BL, an output terminal coupled to the first input terminal of the programmable delay circuit 13, a first voltage input terminal coupled to an output terminal of the first inverter INV1, and a second voltage input terminal coupled to an output terminal of the second inverter INV2.

The second transmission gate PG2 has an input terminal coupled to the second bit line BLB, an output terminal coupled to the second input terminal of the programmable delay circuit 13, a first voltage input terminal coupled to the output terminal of the first inverter INV1, and a second voltage input terminal coupled to the output terminal of the second inverter INV2.

The first inverter INV1 has an input terminal serving as a pre-charging signal input terminal of the drive signal circuit 12 and coupled to the pre-charging signal output terminal of the pre-charging circuit 11, and the output terminal coupled to an input terminal of the second inverter INV2, the first voltage input terminal of the first transmission gate PG1 and the second voltage input terminal of the second transmission gate PG2.

The second inverter INV2 has the input terminal coupled to the output terminal of the first inverter INV1, and the output terminal coupled to the second voltage input terminal of the first transmission gate PG1 and the second voltage input terminal of the second transmission gate PG2.

In some embodiments, the first transmission gate PG1 is substantially used to transmit a signal on the first bit line BL, and the second transmission gate PG2 is substantially used to transmit a signal on the second bit line BLB. Under the control of the pre-charging signal PRE, the first transmission gate PG1 and the second transmission gate PG2 are turned on or off. When the first transmission gate PG1 is turned on, the signal on the first bit line BL is input to the first input terminal of the programmable delay circuit 13 via the first transmission gate PG1; when the second transmission gate PG2 is turned on, the signal on the second bit line BLB is input to the second input terminal of the programmable delay circuit 13 via the second transmission gate PG2.

In practice, specific structures of the first transmission gate PG1 and the second transmission gate PG2 may refer to existing transmission gates, which are not described in detail here.

In some embodiments, the programmable delay circuit 13 includes a NAND gate circuit NAND1, a third inverter INV3 and a delayer Delay1.

The NAND gate circuit NAND1 has a first input terminal serving as the first input terminal of the programmable delay circuit 13, a second input terminal serving as the second input terminal of the programmable delay circuit 13, and an output terminal coupled to an input terminal of the third inverter INV3.

The third inverter INV3 has the input terminal coupled to the output terminal of the NAND gate circuit NAND1, and an output terminal coupled to an input terminal of the delayer Delay1.

The delayer Delay1 has an output terminal serving as the output terminal of the programmable delay circuit 13 and coupled to the first terminal of the charge pump 14.

In some embodiments, the programmable delay circuit 13 further includes a fourth inverter INV4 and a fifth inverter INV5. The fourth inverter INV4 has an input terminal coupled to the output terminal of the delayer Delay1, and an output terminal coupled to an input terminal of the fifth inverter INV5. The fifth inverter INV5 has an output terminal coupled to the first terminal of the charge pump 14.

That is, when the programmable delay circuit 13 includes the fourth inverter INV4 and the fifth inverter INV5, the output terminal of the fifth inverter INV5 serves as the output terminal of the programmable delay circuit 13.

In the embodiments of the present disclosure, by setting the fourth inverter INV4 and the fifth inverter INV5, a phase of the output signal of the programmable delay circuit 13 may be correct, and a slope of the output signal may be relatively gentle.

In some embodiments, a delay duration of the delayer Delay1 may be adjusted according to actual application requirements. Specifically, the delay duration of the delayer Delay1 may be adjusted according to length of the first bit line BL and the second bit line BLB. By using the programmable delay circuit 13, a full custom memory and memory compiler may be adapted.

In some embodiments, the charge pump 14 includes a capacitor C1 and a first NMOS transistor M1.

The capacitor C1 has a first terminal serving as the first terminal of the charge pump 14, and a second terminal serving as the second terminal of the charge pump 14.

The first NMOS transistor M1 has a gate coupled to the first terminal of the capacitor C1, a drain coupled to the second terminal of the capacitor C1, and a source coupled to ground.

In some embodiments, the write driving circuit 15 includes a sixth inverter INV6 and a seventh inverter INV7. The sixth inverter INV6 has an input terminal which is input with a first level, and an output terminal serving as the first output terminal of the write driving circuit 15. The seventh inverter INV7 has an input terminal which is input with a second level, and an output terminal serving as the second output terminal of the write driving circuit 15. Ground terminals of the sixth inverter INV6 and the seventh inverter INV7 are coupled to the second terminal of the charge pump 14.

In some embodiments, the first level is always inverse to the second level. When the first level corresponds to a high level "1", the second level corresponds to a low level "0"; and when the first level corresponds to a low level "0", the second level corresponds to a high level "1".

The inverters in the embodiments of the present disclosure include the first inverter to the seventh inverter which may consist of MOS transistors, for example, NMOS transistors and/or PMOS transistors. Specific structures of the inverter are not limited in the embodiments of the present disclosure.

In some embodiments, the column selector 16 includes a second NMOS transistor M2 and a third NMOS transistor M3.

The second NMOS transistor M2 has a source serving as the first input terminal of the column selector 16, a gate coupled to a gate of the third NMOS transistor M3 and input with a column selection signal, and a drain serving as the first output terminal of the column selector 16.

The third NMOS transistor M3 has a source serving as the second input terminal of the column selector 16, the gate coupled to the gate of the second NMOS transistor M2 and input with the column selection signal, and a drain serving as the second input terminal of the column selector 16.

In some embodiments, drive capability of the third inverter INV3 is ½*X, where X is gate width of an NMOS transistor that constitutes the third inverter INV3. Drive capability of NMOS transistors in the sixth inverter INV6 and the seventh inverter INV7 in the write driving circuit 15 is N*X, and drive capability of the second NMOS transistor M2 and the third NMOS transistor in the column selector 16 is also N*X.

Drive capability corresponding to the first bit line and the second bit line is equivalent to N/2*X, which is N times the drive capability of the third inverter INV3. In the embodiments of the present disclosure, a load of the first bit line BL and the second bit line BLB is N times the load of the delayer Delay1 in the programmable delay circuit.

Figure 2:
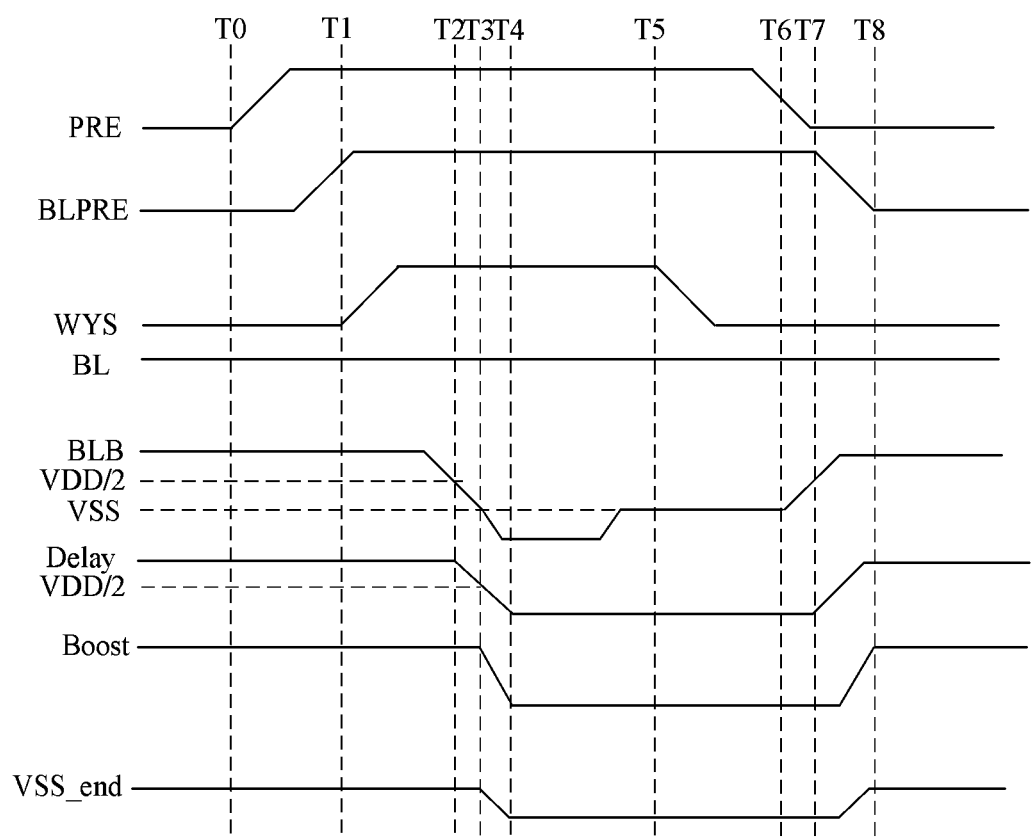
FIG. 2 is a working sequence diagram of a write operation assist circuit according to an embodiment.

Working principles of the write operation assist circuit provided in the above embodiments are described below. FIG. 2 is a working sequence diagram of a write operation assist circuit according to an embodiment. Description is provided in conjunction with FIG. 1.

Before a time point T0, the write operation assist circuit is in a stand by state, where the pre-charging signal PRE is at a low level, and voltages on the first bit line BL and the second bit line BLB are charged to VDD. The pre-charging signal PRE is input to the first inverter INV1, the output signal BLPREB of the first inverter INV1 is at a high level, and the output signal BLPRE of the second inverter INV2 is at a low level. At this time, both the first transmission gate PG1 and the second transmission gate PG2 are turned off. The column selection signal WYS is at a low level, and both the second NMOS transistor M2 and the third NMOS transistor M3 are turned off. Both a first feedback signal BL_end output by the first transmission gate PG1 and a second feedback signal BL_end output by the second transmission gate PG2 are at a high level, the output terminal of the programmable delay circuit 13 also outputs a high level, the first NMOS transistor M1 is turned on, and VSS_end is pulled down to VSS.

From time points T0 to T1, the pre-charging signal PRE is on a rising edge, the output signal BLPREB of the first inverter INV1 switches from a low level to a high level, and the output signal BLPRE of the second inverter INV2 switches from a high level to a low level. Both the first transmission gate PG1 and the second transmission gate PG2 are turned on, and both the first feedback signal BL_end and the second feedback signal BL_end hold at a high level. At this time, the output terminal of the programmable delay circuit 13 also outputs a high level, the first NMOS transistor M1 is still turned on, and the level of VSS_end holds at VSS.

At the time point T1, the column selection signal WYS is at a rising edge, and the write driving circuit 15 outputs an inverted signal to the first bit line BL and the second bit line BLB, respectively. As illustrated in FIG. 2, the seventh inverter INV7 is input with a low level "0", and the sixth inverter INV6 is input with a high level "1", that is, the signal on the first bit line BL is at a high level "1", and the signal on the second bit line BLB is at a low level "0".

As the signal on the second bit line BLB is at a low level "0", the voltage on the second bit line BLB is pulled down to VSS. At a time point T2, the voltage on the BLB is pulled down from VDD to VDD/2. At this time, the third inverter INV3 starts to invert and generates a delay signal Delay whose signal is a falling edge. As the drive capability of the third inverter INV3 is 1/N of the combined drive capability of the sixth inverter INV6 and the second NMOS transistor M2, and a load of Delay1 is 1/N of the load of the second bit line BLB, a waveform of a falling edge of the delay signal Delay generated by the third inverter INV3 is consistent with a waveform of a falling edge of the second bit line BLB.

At a time point T3, the level of the delay signal Delay drops from VDD to VDD/2. At the same time, as the waveform of the second bit line BLB is the same as that of the delay signal Delay, the level of the second bit line BLB is pulled down to VSS at the time point T3 as well. As the level of the delay signal Delay reaches VDD/2, the fourth inverter INV4 and the fifth inverter INV5 start to invert, and a Boost signal of a falling edge is obtained, that is, the output signal of the programmable delay circuit 13 is on the falling edge from the time point T3.

From time points T3 to T4, the level of the Boost signal is pulled down from VDD to VSS, and the level of VSS_end is pulled down from VSS to a negative voltage via the capacitor C1. The negative voltage of VSS_end is coupled to the NMOS transistors in the sixth inverter INV6 and the seventh inverter INV7. As Vgs corresponding to an NMOS transistor whose gate is coupled to the negative voltage of VSS_end in the sixth inverter INV6 is higher than 0, the NMOS transistor is turned on, and the level of the second bit line BLB is pulled down to the negative voltage. At this time, the second bit line BLB writes "0" to a memory cell.

At a time point T5, the column selection signal WYS starts a recovery operation, the level of the column selection signal WYS begins to drop, the second NMOS transistor M2 and the third NMOS transistor M3 are turned off, and the write driving circuit 15 no longer drives signals input to the bit line BL and the second bit line BLB, and a recovery of the write operation is started.

At a time point T6, the pre-charging signal PRE is at a falling edge, the voltages on the first bit line BL and the second bit line BLB are pre-charged to a high level, and the rising edge of the second bit line BLB is transmitted to the output terminal of the second transmission gate PG2 via the second transmission gate PG2. At a time point T7, the delay signal Delay is on the rising edge. Afterward, at a time point T8, Boost is on the rising edge and pulls the voltage of VSS_end up from the negative voltage via the capacitor C1. At this time, the gate of the first NMOS transistor M1 is at a high level, thus, the first NMOS transistor M1 is turned on, the voltage of VSS_end is finally pulled up to VSS, and the recovery of the write driving circuit 15 is completed.

From above, in embodiments of the present disclosure, a write driving circuit outputs a first level to a first bit line, and outputs a second level to a second bit line, and the first level is inverse to the second level. A charge pump is driven to operate by the first bit line and the second bit line. Therefore, when writing to a SRAM, no external drive signal is required to drive the charge pump, and no drive signal with strict timing requirements is required.

Although the present disclosure has been disclosed above with reference to preferred embodiments thereof, it should be understood that the disclosure is presented by way of example only, and not limitation. Those skilled in the art can modify and vary the embodiments without departing from the spirit and scope of the present disclosure.

What is claimed is:

1. A write operation assist circuit, comprising a pre-charging circuit, a drive signal circuit, a programmable delay circuit, a charge pump, a write driving circuit and a column selector,
    wherein the pre-charging circuit has a pre-charging signal output terminal coupled to a pre-charging signal input terminal of the drive signal circuit, a first voltage output terminal coupled to a first bit line, and a second voltage output terminal coupled to a second bit line,
    the driving signal circuit has a first input terminal coupled to the first bit line, a second input terminal coupled to the second bit line, a first output terminal coupled to a, first input terminal of the programmable delay circuit, and a second output terminal coupled to a second input terminal of the programmable delay circuit,
    the programmable delay circuit has an output terminal coupled to a first terminal of the charge pump,
    the charge pump has a second terminal coupled to a ground terminal of the write driving circuit,
    the write driving circuit has a first input terminal which is input with a first level, a second input terminal which is input with a second level, a first output terminal coupled to a first input terminal of the column selector, and a second output terminal coupled to a second input terminal of the column selector, wherein the first level is inverse to the second level; and
    the column selector has a first output terminal coupled to the first bit line, and a second output terminal coupled to the second bit line.

2. The write operation assist circuit according to claim 1, wherein the pre-charging circuit comprises a first PMOS transistor, a second PMOS transistor and a third PMOS transistor,
    wherein the first PMOS transistor has a source coupled to a voltage source, a gate coupled to a gate of the second PMOS transistor and a gate of the third PMOS transistor, and a drain coupled to a source of the third PMOS transistor,
    the second PMOS transistor has a source coupled to the voltage source, the gate coupled to the gate of the third PMOS transistor and the gate of the first PMOS transistor, and a drain coupled to a drain of the third PMOS transistor; and
    the third PMOS transistor has a source coupled to the drain of the first PMOS transistor, the gate coupled to the gate of the first PMOS transistor and the gate of the second PMOS transistor, and the drain coupled to the drain of the second PMOS transistor.

3. The write operation assist circuit according to claim 1, wherein the drive signal circuit comprises a first transmission gate, a second transmission gate, a first inverter and a second inverter,
    wherein the first transmission gate has an input terminal coupled to the first bit line, an output terminal coupled to the first input terminal of the programmable delay circuit, a first voltage input terminal coupled to an output terminal of the first inverter, and a second voltage input terminal coupled to an output terminal of the second inverter,
    the second transmission gate has an input terminal coupled to the second bit line, an output terminal coupled to the second input terminal of the programmable delay circuit, a first voltage input terminal coupled to the output terminal of the first inverter, and a second voltage input terminal coupled to the output terminal of the second inverter,
    the first inverter has an input terminal coupled to the pre-charging signal output terminal of the pre-charging circuit, and the output terminal coupled to an input terminal of the second inverter; and
    the second inverter has the output terminal coupled to the second voltage input terminal of the first transmission gate and the second voltage input terminal of the second transmission gate.

4. The write operation assist circuit according to claim 1, wherein the charge pump comprises a capacitor and a first NMOS transistor,
    wherein the capacitor has a first terminal serving as the first terminal of the charge pump, and a second terminal serving as the second terminal of the charge pump; and
    the first NMOS transistor has a gate coupled to the first terminal of the capacitor, a drain coupled to the second terminal of the capacitor, and a source coupled to ground.

5. The write operation assist circuit according to claim 1, wherein the programmable delay circuit comprises a NAND gate circuit, a third inverter and a delayer,
    wherein the NAND gate circuit has a first input terminal serving as the first input terminal of the programmable delay circuit, a second input terminal serving as the second input terminal of the programmable delay circuit, and an output terminal coupled to an input terminal of the third inverter,
    the third inverter has an output terminal coupled to an input terminal of the delayer; and
    the delayer has an output terminal serving as the output terminal of the programmable delay circuit and coupled to the first terminal of the charge pump.

6. The write operation assist circuit according to claim 5, wherein the programmable delay circuit further comprises a fourth inverter and a fifth inverter,
    wherein the fourth inverter has an input terminal coupled to the output terminal of the delayer, and an output terminal coupled to an input terminal of the fifth inverter; and
    the fifth inverter has an output terminal coupled to the first terminal of the charge pump.

7. The write operation assist circuit according to claim 5, wherein load capacity of the first bit line is N times load capacity of the delayer, and load capacity of the second bit line is N times the load capacity of the delayer.

8. The write operation assist circuit according to claim 1, wherein the write driving circuit comprises a sixth inverter and a seventh inverter, wherein the sixth inverter has an input terminal which is input with a first level, and an output terminal serving as the first output terminal of the write driving circuit, the seventh inverter has an input terminal which is input with a second level, and an output terminal serving as the second output terminal of the write driving circuit; and ground terminals of the sixth inverter and the seventh inverter are coupled to the second terminal of the charge pump.

9. The write operation assist circuit according to claim 1, wherein the column selector comprises a second NMOS transistor and a third NMOS transistor, wherein the second NMOS transistor has a source serving as the first input terminal of the column selector, a gate coupled to a gate of the third NMOS transistor and input with a column selection signal, and a drain serving as the first output terminal of the column selector; and the third NMOS transistor has a source serving as the second input terminal of the column selector, the gate coupled to the gate of the second NMOS transistor and input with the column selection signal, and a drain serving as the second input terminal of the column selector.

* * * * *